(12) United States Patent
Guenter et al.

(10) Patent No.: US 7,346,087 B2
(45) Date of Patent: Mar. 18, 2008

(54) METHOD FOR PERFORMING EYE SAFETY MEASUREMENTS ON LASER EMITTER DEVICES

(75) Inventors: James K. Guenter, Garland, TX (US); Andre Lalonde, Allen, TX (US)

(73) Assignee: Finisar Corporation, Sunnyvale, CA (US)

( * ) Notice: Subject to any disclaimer, the term of this patent is extended or adjusted under 35 U.S.C. 154(b) by 312 days.

(21) Appl. No.: 11/072,192

(22) Filed: Mar. 4, 2005

(65) Prior Publication Data

US 2006/0198405 A1     Sep. 7, 2006

(51) Int. Cl.
*H01S 3/00* (2006.01)
*H01S 3/13* (2006.01)

(52) U.S. Cl. ............... 372/29.021; 372/38.02

(58) Field of Classification Search .......... 372/29.021, 372/38.01, 38.02
See application file for complete search history.

(56) References Cited

U.S. PATENT DOCUMENTS 7,065,112 B2 * 6/2006 Ghosh et al. .............. 372/32

2002/0075910 A1 * 6/2002 Imaki et al. ............. 372/29.02
2004/0081466 A1 * 4/2004 Walther et al. ............. 398/152
2006/0176800 A1 * 8/2006 Colbum et al. ............. 369/116

OTHER PUBLICATIONS

Boucouvalas, et al., "IEC 825-1 Eye Safety Classification of Some Consumer Electronic Products," Bournemouth University, School of Electronics, pp. 1-3.
Boucouvalas, et al., "Appendix: Sample Calculations," Bournemouth University, School of Electronics, pp. 4-6.
"OFCS Power Limits," IEC, 2004, pp. 22-28.

* cited by examiner

*Primary Examiner*—Armando Rodriguez
(74) *Attorney, Agent, or Firm*—Workman Nydegger (57) ABSTRACT

A method of performing eye safety measurements on laser devices is disclosed. The laser is contained within a housing having a central bore. The method uses an optical detector having at least two zones to make separate measurements of both a direct power coming from the laser and an indirect power reflected off of the central bore. The first zone measuring the direct power is smaller than the second zone measuring the indirect power. The measurement of the first power is then used to adjust the power of the laser to be within a specified optical standard, such as the class 1 standard. In one exemplary embodiment, the laser is an 850 nanometer Vertical Cavity Surface Emitting Laser (VCSEL).

19 Claims, 6 Drawing Sheets

Fig. 7

METHOD FOR PERFORMING EYE SAFETY MEASUREMENTS ON LASER EMITTER DEVICES

CROSS-REFERENCE TO RELATED APPLICATIONS

Not applicable.

BACKGROUND OF THE INVENTION

1. The Field of the Invention

Exemplary embodiments of the present invention relate to the field of laser devices. More specifically, the exemplary embodiments relate to a segmented detector for performing eye safety measurements on a laser device.

2. The Relevant Technology

Laser devices are used in a variety of applications. For example, laser devices are used as data transmitters in optical networks, providing very high bandwidth and data carrying capabilities. Regardless of the specific application, every application that uses a laser device must conform to some level of eye safety. Ideally, the laser falls within the safest category, which is known as Class 1. Typical fiber optic transceivers are designed to have maximum optical output power levels which meet Class 1 eye safety limits, and are thus safe for unprotected viewing without precautions. This Class 1 eye safety limit must be met under all conditions, including all reasonable single fault conditions, which are defined as reasonable failures of a single component or connection. The specific details of the Class 1 standard are specified in International Electrotechnical Commission (IEC) 60825-1:1993+A1:1997+A2:2001, "Safety of laser products—Part 1: Equipment classification, requirements and user's guide", Edition 1:1993 with amendments 1:1997 and 2:2001. In order to ensure that this standard is met, the laser output power must be measured using appropriate measuring equipment.

In general, prior art designs ensure eye safety by one of two methods. In the simplest case, the laser and optical system is fundamentally eye safe because the maximum power the device can emit is less than the eye safety limit. This is often the case in longer wavelength lasers that operate in the 1310-1550 nanometer (mu) bands. In other cases, particularly those involving shorter wavelength 850 nm lasers, the eye safety limit is ensured by redundant electrical circuits that monitor either the laser current or, more directly, monitor the laser output power through a monitor photodiode. Redundant systems are required, because the overall monitoring system must continue to function in the event of the failure of a single electrical component or connection.

Unfortunately, the design of short wavelength optical transceivers is often complicated by the fact that the desired normal operating power is often quite close to, if not just below, the eye safety limit. This is true because the maximum data transmission rates for optoelectronic devices occur at the maximum power output. Therefore, designing a system to reliably distinguish between normal and unsafe levels of laser power is challenging. In fact, the standards for acceptable output power are often defined by a minimum value for communications reliability and a maximum which corresponds to the eye safety limit. The desire to have the largest usable output power range will thus tend to make the problem of eye safety more difficult.

Figure 1:
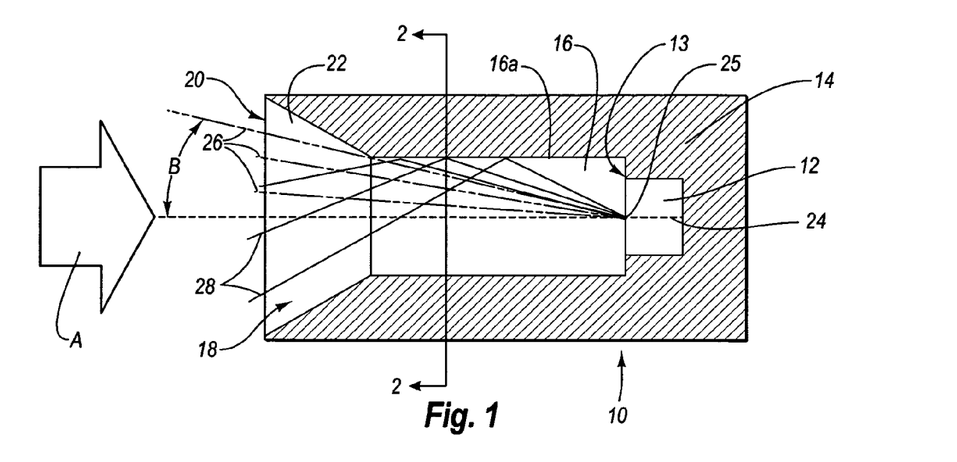
FIG. 1 illustrates a cross-sectional view of an exemplary laser device package.

One example of a portion of an exemplary laser device package that may require monitoring for eye safety is shown in FIG. 1 and designated generally as reference numeral 10.

Package 10 schematically illustrates a cross section of a laser emitter 12 in a housing 14. Housing 14 defines a cylindrical central bore 16 having a first end 13 immediately adjacent laser emitter 12, and a second end 20 located distally from laser emitter 12. Second end 20 can have a flared portion 18 that has an increasing diameter when going from end 13 towards end 20.

Laser emitter 12 has an optical axis 24 that also corresponds to the axis of central bore 16. The central bore 16 is sized and configured to accept a ferrule (not shown) containing, for example, an optical fiber capable of transmitting optical signals from emitter 12 to some remote location. In this example, laser emitter 12 is a vertical cavity surface emitting laser (VCSEL) that operates according to the 10 gigabit per second (Gb/s) standard form factor pluggable (XFP) standard. Bore 16 can then accept a standard plug, such as an LC connector plug. Other types of emitters, data speeds, and plugs are also possible.

Laser emitter 12 transmits a laser beam at a point 25. While, in this embodiment, laser emitter 12 is shown as being contained within housing 14, and transmitting a laser beam at point 25, this need not be the case. Laser emitter 12 can be located at any point behind housing 14, and the laser beam focused to point 25 using, for example, one or more lenses. In either case, point 25 is the apparent source for the laser beam that enters bore 16.

While the laser beam that is transmitted from point 25 is actually one coherent beam, it is perceived by a viewer looking at bore 16, represented by an arrow A, as being divided into two parts. A first part 26 is transmitted directly from point 25 to a point external to bore 16, while a second part 28 is reflected off of an inside wall 16a of bore 16. Unfortunately, this makes it somewhat problematic to measure the output power of laser emitter 12 to verify whether the eye safety limits for Class 1 devices, or any other eye safety limits, are being met.

First part 26 will be generally shaped like a cone. When viewed perpendicularly, this cone will appear as a circle having a specific area. One way to calculate the area of this circle is to use a measurement of the numerical aperture that is defined as the sine of the vertex angle of the largest cone of meridional rays that can enter or leave an optical system or element, multiplied by the refractive index of the medium in which the vertex of the cone is located. The vertex angle is represented in FIG. 1 as angle "B". In this embodiment, the refractive index of the air is 1. Using standard formulas known to those of skill in the art, the numerical aperture for one example geometric configuration can then be calculated as 0.18.

Figure 2:
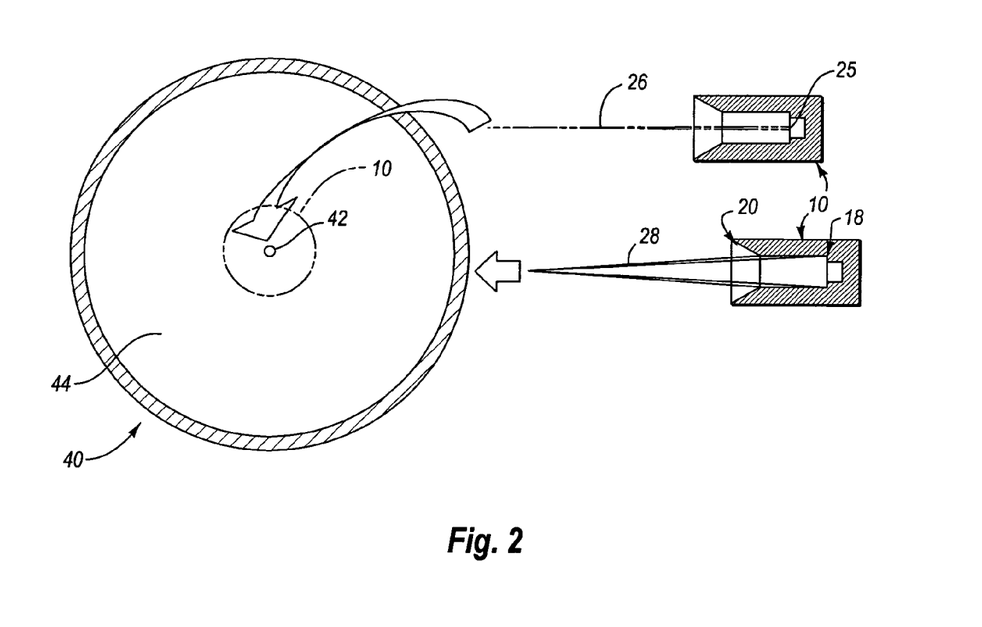
FIG. 2 shows the view looking into the laser device of FIG. 1 along the lines 2-2, from 100 millimeters away.

The problem of measuring the output power of both components of the beam is shown generally in FIG. 2 (not to scale). FIG. 2 illustrates the view looking into the barrel of device 10 from about 100 mm away. Beam 26, which comes directly from point 25, is directed to a point 42 having a subtense of approximately 0.3 milli-radians (mrad). Beam 28, which is reflected off of inside wall 16a, has a subtense of approximately 12.5-12.9 mrad, which is illustrated by the hatched portion of the circular representation of the beams 26 and 28, depending on whether the reflection, and therefore the apparent source, is from end 18 or end 20. To make an accurate determination of eye safety, it is desirable to measure the intensity or optical power of both beam 26 and beam 28 separately.

Currently, making an accurate measurement of both optical powers requires an operator to use expensive optical characterization equipment. Additionally, using such equipment to make the measurements requires a significant amount of time. This corresponds directly to a significant amount of money expended to make these measurements.

BRIEF SUMMARY OF THE EXEMPLARY EMBODIMENTS

It would, therefore, be a great improvement in the art if some device or method could be developed that provided for separate measurements of the optical power of both the direct laser beam and the reflected laser beam. These measurements could then be used to calculate the maximum optical power that could be produced by a particular device and still stay within the Class 1 eye safety limits. Exemplary embodiments of the present invention provide a segmented detector for simultaneously measuring both components of laser optical power in a single device.

In one embodiment, a printed circuit board (PCB) is disposed within a housing. The PCB can include a dual, co-planar, laser power detector that can separately measure both the direct and indirect optical power from a given laser. A first portion of the detector can be a circular area with a first diameter for measuring the direct optical power of the laser. A second portion of the detector can be a second area with a second diameter larger than the first diameter for measuring the reflected optical power.

In some embodiments, the PCB can also include one or more standard connections to facilitate the connection of external monitors or other equipment to the PCB/detector. In some embodiments, these connectors can include an eight position Molex connector, a twenty-six pin ribbon connector, and/or other standard or non-standard connectors known to those of skill in the art. The PCB can have a multi-layered trace structure providing connections between components.

In one method, the detector is used to measure both components of the optical power; first component transmitted directly to the sensor and second component reflected from a surface before being incident to the sensor. These measurements are then used to assure that the optical power is below the Class 1 eye safety limit. The amount of power being generated by a laser is measured as a function of the area over which the components of the beam are spread. For example, in most laser applications, the first component includes most of the power of the laser. The second component is measured over a much wider area. In one test configuration, using a laser transmitting at 850 nanometers, the first component can have a power of about −1.09 decibel milliwatts (dBm), while the corresponding second component can have a power of about +7.9 dBm. Since the first component is measured over an area smaller than the second component, and since in general the corresponding power of the second component is much less than the power of the first component, the measure of the first component can be used to adjust the power of the laser until the first component, by itself, is just below the Class 1 eye safety limit. Since some of the optical power is contained in the second component, this method allows the laser to run at a higher power, and therefore be more efficient.

The method of measuring the laser power described above allows separation of the power of the laser that actually needs to be considered for the eye safety measurement from the power that need not be. This provides a distinct advantage over systems that measure the total power as one measurement. Specifically, using the exemplary embodiment of the method described above, the laser can now be operated at a slightly higher and therefore more efficient power level while remaining as a Class 1 laser.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EMBODIMENTS

Embodiments of the present invention provide a detector, such as a segmented detector, for simultaneously measuring the optical power of both the direct component and the reflected component of a laser beam for a test device. These measurements can then be used to calculate the maximum optical power that can be produced by the device and still stay within desired eye safety limits. Exemplary embodiments of the present invention provide a device and methods that measure both components of laser optical power, and use these measurements to maximize the amount of power that can be emitted from the laser device without exceeding a predetermined maximum.

Following is a discussion of the testing device used to determine the optical power levels of different components of a laser beam. Thereafter, a discussion of the method using the testing device to maximize the power level of the laser to increase the efficiency of the laser, while maintaining the power level below a predetermined threshold above which the classification of the laser changes. For instance, the method can be used to maximize the power level of a Class 1 laser.

Figure 3:
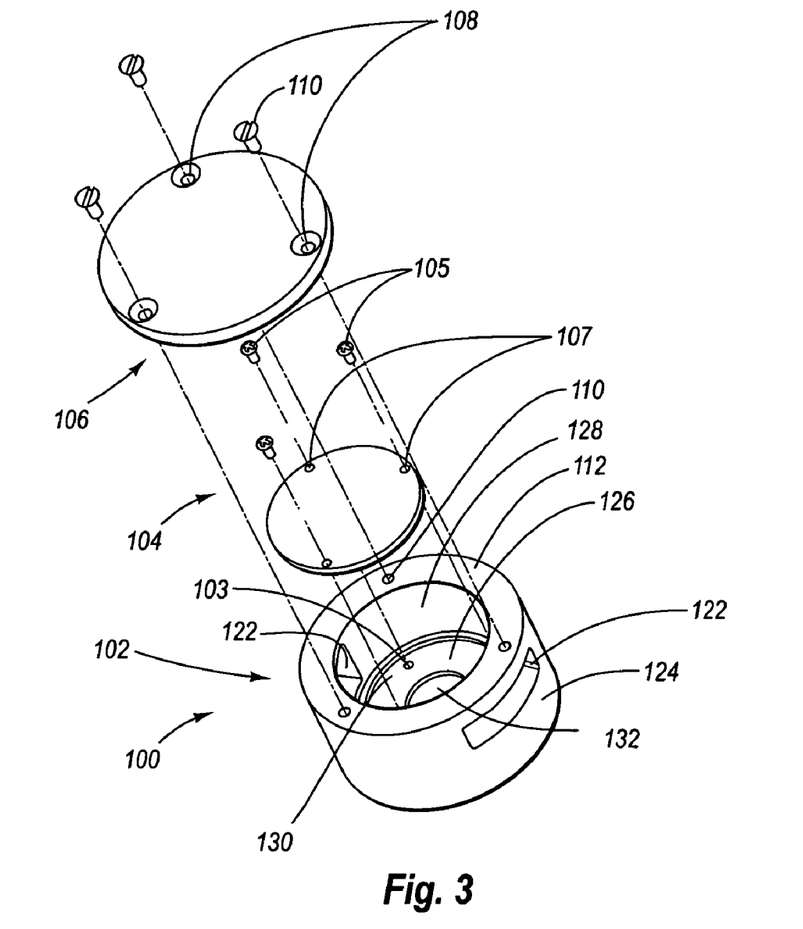
FIG. 3 illustrates an exploded perspective view of one exemplary segmented detector according to the present invention.
Figure 4:
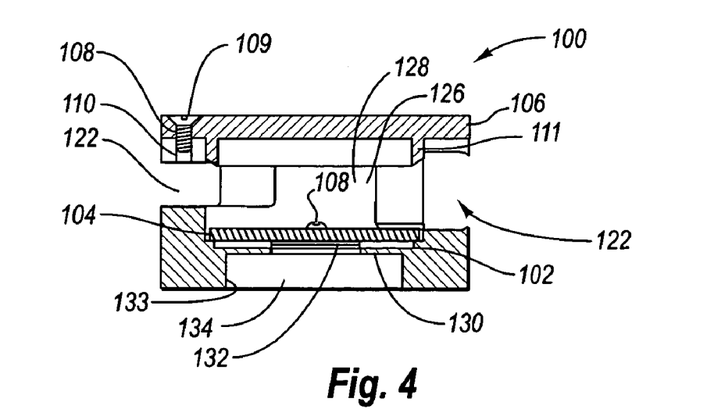
FIG. 4 illustrates a cross-sectional side view of the assembled segmented detector of FIG. 3.

One exemplary embodiment of the device for testing laser eye safety is shown in FIGS. 3 and 4, and designated generally as reference numeral 100. This device 100 can be a segmented detector, although other detectors are possible. The detector 100 can include a cylindrical housing 102, a printed circuit board (PCB) 104 disposed within housing 102, and a cover plate 106. The housing 102 can include one or more fastener holes 103 that accommodate one or more fasteners 105. These fasteners 105 can be used to secure PCB 104 to housing 102 via one or more screw holes 107. Cover plate 106 can include one or more holes 108 that can accommodate one or more mechanical fasteners 109. The fasteners 108 can be used to secure cover plate 106 to housing 102 via one or more fastener holes 110.

In exemplary embodiments, cover plate 106 can have a circular lip 111 (FIG. 4) extending around the inside surface. The lip 111 can have an outside diameter that is just slightly smaller than the inside diameter of housing 102, thus facilitating a more secure fit for cover plate 106. Alternately, cover plate 106 can be secured to a top surface 112 of housing 102 using, by way of example and not limitation, chemical fasteners, threads, or any other system or method know to those of skill in the art for fixing one part to another.

Housing 102 can also have one or more apertures 122 through an outside surface 124. The apertures 122 extend into an inner cavity 126 having an inside surface 128. Apertures 122 provide access to PCB 104 so that various wires or other attachments can be connected to PCB 104. An annular ring 130 can also be connected to inside surface 128 of housing 102. Annular ring 130 provides a support platform to attach PCB 104 to housing 102. As with cover plate 106, PCB 104 can be attached to annular ring 130 using chemical or mechanical fasteners. Alternately PCB 104 can attach directly to housing 102. Annular ring 130 also includes a window 132 that exposes a surface of PCB 104 during laser testing. This surface area of PCB 104 contains the photodetectors that perform the actual power measurements. The specific structure of PCB 104 will be discussed below with reference to FIGS. 5A through 5G.

Corresponding to window 132 is an opening 134 in the bottom of housing 102. This opening 134 allows passage of the laser beams to be measured. In exemplary embodiments, opening 134 is configured to fit over, for example, laser housing 14 of laser device package 10 (FIG. 1). In alternate embodiments, opening 134 is configured to receive a ferrule containing one end of a fiber optic cable. The other end of the fiber optic cable can be inserted into, by way of example and not limitation, central bore 16 of laser device package 10. In some embodiments, opening 134 can include threads on an inside surface 133. The threads can facilitate a more secure fit to attach the laser device being tested. In other alternate embodiments, surface 133 can have a light absorbing coating applied to it or some other light absorbing material attached to it.

While the embodiment of housing 102 shown in FIGS. 3 and 4 has a cylindrical shape, this need not be the case. Housing 102 can have any shape that provides sufficient structure to securely hold PCB 104, and that functions to fix the position of photodetectors on PCB 104 with respect to an optoelectronic device to be tested. Such shapes can include, by way of example and not limitation, oval, square, rectangular, and other polygonal shapes. Likewise, housing 102 can be made from metal or a metal alloy. In this exemplary embodiment, housing 102 is made from an anodized aluminum. However, other materials are also possible, including, but not limited to, plastics, composites, synthetics, or any other material having sufficient rigidity and that functions to fix the photodetectors on PCB 102 with respect to a laser emitter.

Figure 5A:
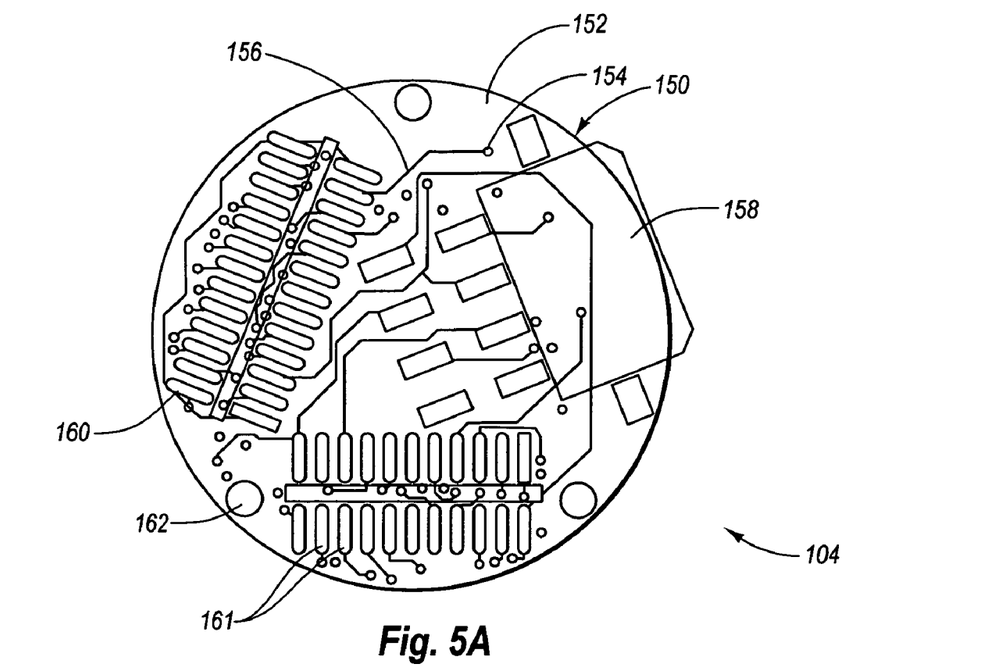
FIGS. 5A through 5F illustrate one exemplary construction of the printed circuit board used in the segmented detector of FIGS. 3 and 4.
Figure 5B:
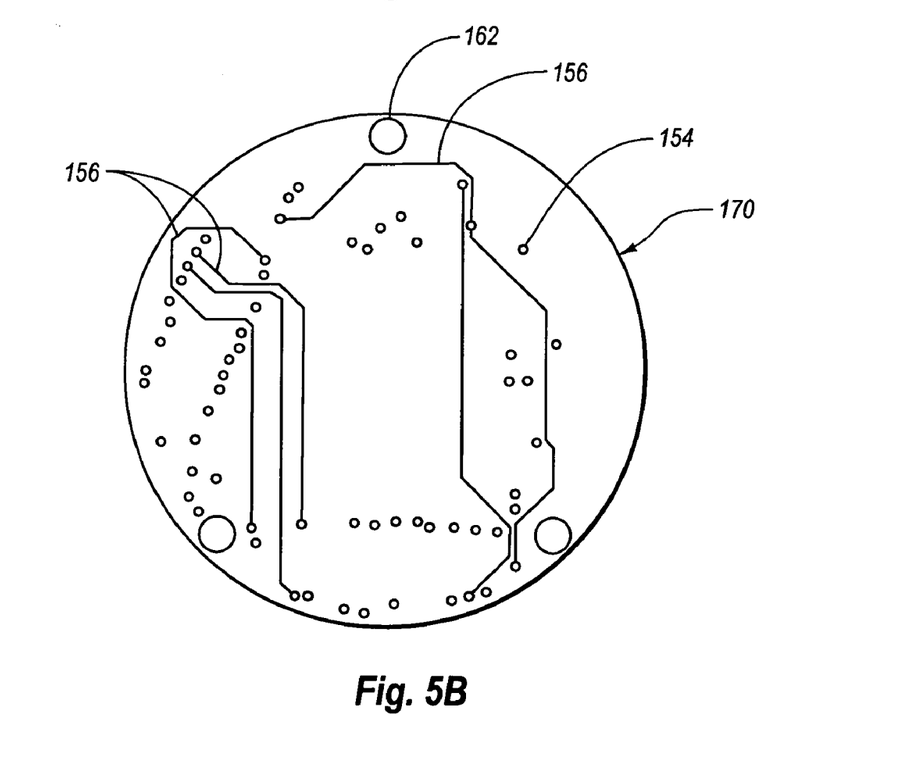
Figure 5C:
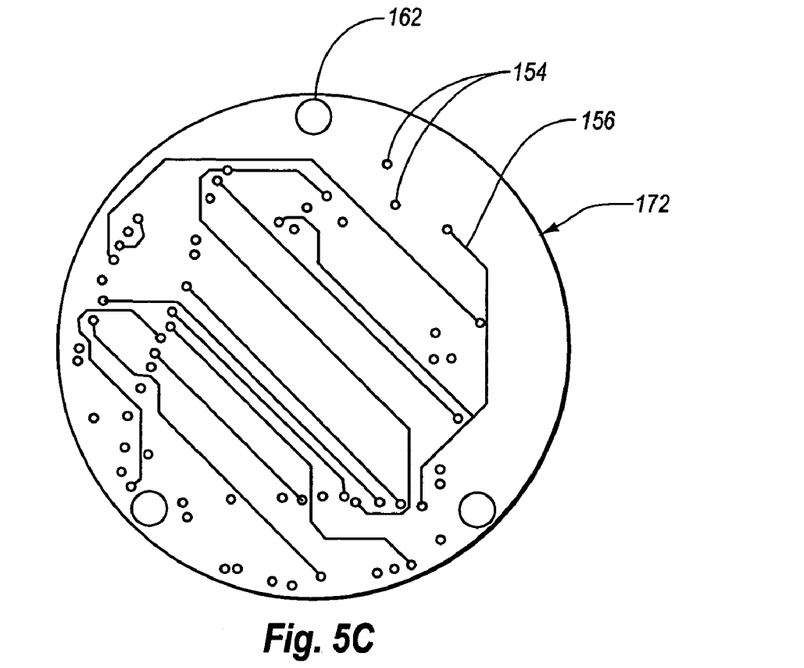
Figure 5D:
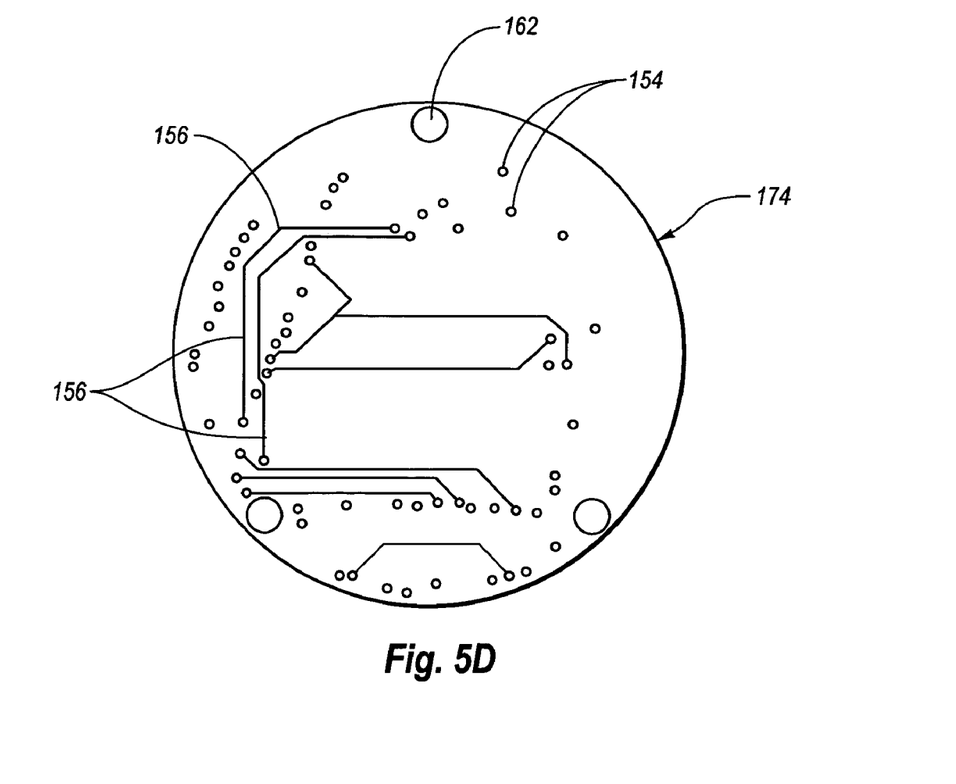
Figure 5E:
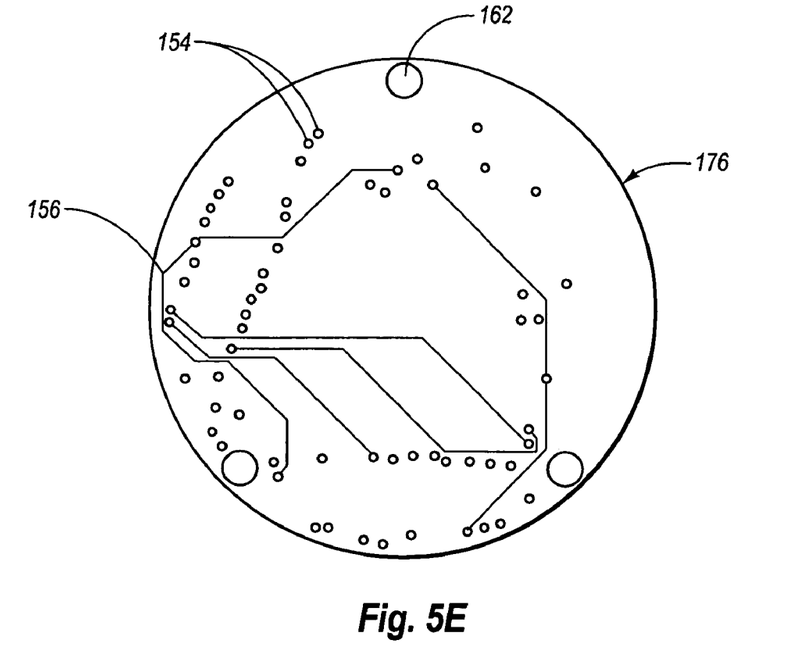

FIGS. 5A-5F illustrate one embodiment of PCB 104 constructed in accordance with the present invention. FIG. 5A illustrates a schematic view of a top layer 150 of PCB 104. Top layer 150 includes a top surface 152. A plurality of plated through holes 154 and electrical traces 156 can be disposed on top surface 152. The plated through holes 154 enable electrical conductivity between layers, while the electrical traces 156 connect various points on a single layer. One or more eight position Molex connectors 158 and one or more twenty-six pin ribbon cable connectors 160 can also be disposed on top surface 152. In some embodiments, a plurality of jumpers 161 can be disposed on top surface 150 to allow an operator to configure the connectors 160, 162 as desired. Other types of connectors and cables can also be used.

FIGS. 5B-5E illustrate exemplary embodiments of mid layers 1 through 4, respectively, designated generally as reference numerals 170, 172, 174, and 176, respectively. While this exemplary embodiment employs a six layer structure, any other number of layers can also be used. For instance, in some exemplary embodiments, only a top and bottom layer is present. In other embodiments many more layers can be used, depending on the complexity and electrical functionality of the circuits involved. As with top layer 150, each of layers 1 through 4 can include one or more plated through holes 154, and one or more electrical traces 156 connecting through holes 154.

Figure 5F:
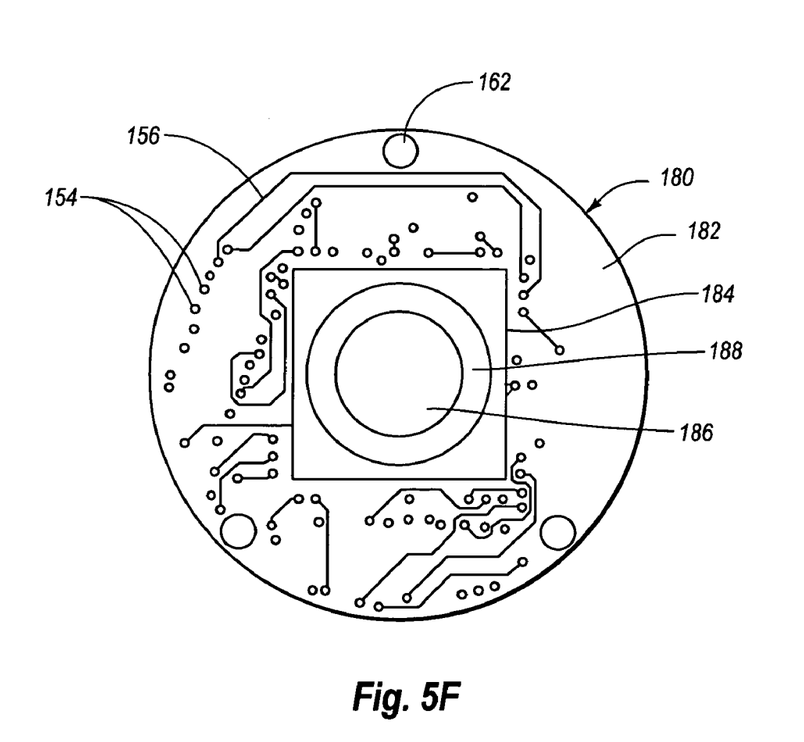

FIG. 5F illustrates one exemplary bottom layer 180 of PCB 104. Bottom layer 180 includes a surface 182. As with the other layers, surface 182 includes the plurality of plated through holes 154 and electrical traces 156. Additionally, surface 182 can include a laser detector 184. Laser detector 184 can be constructed from silicon, gallium arsenide, or any other semiconductor with sensitivity appropriate for the wavelength of the laser to be tested. In exemplary embodiments, laser detector 184 can include multiple detection areas. For example, in one configuration, connector 160 and jumpers 161 can be configured such that twenty-four of the individual leads on the connector each correspond to one of the twenty-four individual areas on detector 184. These areas can be aggregated as desired into two or more detection zones, that can be used to separately detect the power in first beam 26 and second beam 28 (FIG. 1). For instance, as shown in FIG. 5F, the detector 184 can include a first zone 186 and a second zone 188. These zones will be discussed in more detail with reference to FIGS. 6A-7. Alternatively, the power level detected at each of the twenty-four individual areas can be measured and used during the testing process.

Specific construction techniques for printed circuit boards are well known in the art. The underlying substrate can be made from, by way of example and not limitation, plastics, polymers, composite compounds, glass, etc. As many layers as desired can be joined together, with the plated through holes passing through all of the layers and sealing the layers to each other. Alternately, some of the plated through holes can pass through some of the layers, while others pass through different layers.

It is understood that FIGS. 5A-5F illustrate one exemplary configuration of the various electrical traces, components and connectors. The electrical traces illustrated provide electrical connectivity to the illustrated components. However, many other patterns of traces and components can be used. The invention is therefore not limited to the exemplary embodiment of the PCB shown. Any detector providing for a measurement of two different optical powers on one planar surface is contemplated to fall within the scope of the exemplary embodiments.

There are three different scenarios for testing whether or not a laser, such as VCSEL in FIG. 1, complies with the eye safety requirements of a Class 1 laser. The laser should meet criteria from all three scenarios, which effectively means that compliance is based on whichever of the three is most restrictive for a given case. Following hereinafter is a discussion of the three possible scenarios and methods of using the detector 100 to measure the power level of the laser beam to verify that the laser meets the criteria for a Class 1 safety categorization. These exemplary scenarios are illustrated schematically in FIGS. 6A-6C for the exemplary laser shown in FIG. 1.

Figure 6A:
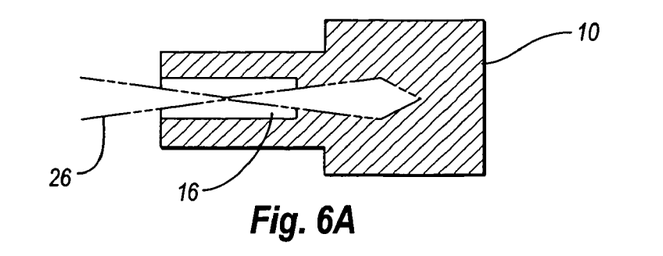
FIG. 6A illustrates one case that can be considered when measuring an optical power of the laser device of FIG. 1.

In a first scenario, shown in FIG. 6A, the divergence of laser beam 26 is low and all of the optical power of the laser beam 26 exits the barrel 16 without reflection. According to the IEC standards, the acceptable exposure limit (AEL) of laser beam 26 can be provided by the following equation:

$$AEL = 3.9 \times 10^{-4} C_4 C_7 \quad (1)$$

$C_7$ is a standard constant having a value of 1. $C_4$ can be defined by the following equation:

$$C_4 = 10^{0.002(\lambda - 700)} \quad (2)$$

where $\lambda$ is the wavelength of the laser to be tested. Using equation 2, the value of $C_4$ for an 850 nm laser can be 1.995. Consequently, to comply with the requirements for a Class 1 laser, the AEL of an 850 nm laser, as measured by a detector having a diameter of 50 mm at a distance of 100 mm from the VCSEL, should not exceed −1.09 decibel milliwatts (dBm). In this first scenario, however, only emissions within a numerical aperture (NA) of 0.18, which is the maximum NA of a ray that could exit the barrel 16 of the laser 10 without reflection, need be considered.

Although testing can be performed with detectors having the above-identified diameter and position, the standards allow for use of substitute test methods so long as they use the same numerical aperture to measure the power level of the beam 26 that exits the barrel 16 without reflection. Consequently, it is also possible to test a VCSEL using a detector having a diameter of 7.11 mm at a distance of 19.3 mm and a numerical aperture of 0.18.

Figure 6B:
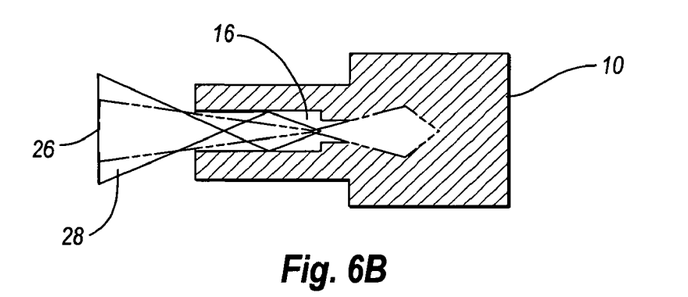
FIG. 6B illustrates an alternate case that can be considered when measuring an optical power of the laser device of FIG. 1.

In a second scenario, shown in FIG. 6B, some divergence of the laser beam takes place. This results in both direct beam component 26 and reflected beam 28 component exiting the barrel 16. According to the IEC standards, the AEL generated by both beam 26 and beam 28 can be provided by the following equation:

$$AEL = 7 \times 10^{-4} C_4 C_6 C_7 T_2^{-0.25} \quad (3)$$

where, $$C_6 = \frac{\alpha}{\alpha_{min}} \text{ and} \quad (4)$$

and $$T_2 = 10 \times 10^{\left[\frac{(\alpha - \alpha_{min})}{98.5}\right]} \quad (5)$$

$\alpha$ is either (i) the angle of the beam reflected at the near end of the barrel 16 or (ii) the angle of the beam reflected at the far end of the barrel 16. A beam having the smaller angle between the above would be more focused and so damage an eye more quickly. The smaller of the two angles, therefore, is used to determine the AEL. In this exemplary configuration, the value of $\alpha$ can be about 12.5 mrad, while $\alpha_{min}$ is the minimum angle of the non-reflected beam exiting from the barrel 16. The value of $\alpha_{min}$ can be about 1.5 mrad. Resultantly, in one configuration $C_4$ can be 1.995, $C_6$ can be 8.33, $C_7$ can be 1 and $T_2$ can be 12.93.

To comply with the requirements for a Class 1 laser, therefore, a total power level of both the direct beam component 26 and the reflected beam 28 of a 850 nm laser, measured by a detector having a diameter of 50 mm at a distance of 100 mm from the VCSEL, must not exceed +7.88 dBm, from Equations 3-5. Since the actual measured power is a function of the area of the detector, the allowable power level is much higher than the power of the direct beam 26. With this configuration, i.e., 50 mm diameter detector positioned 100 mm from the laser, the numerical aperture is 0.243. Again, it is possible to substitute detectors having other diameters and other locations relative to the laser so long as the numerical aperture is at least 0.243.

Figure 6C:
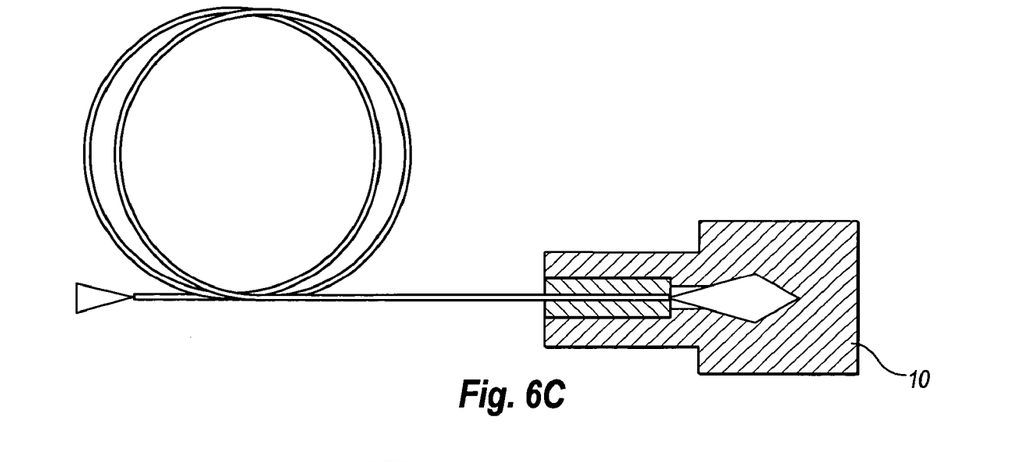
FIG. 6C illustrates a third alternate case that can be considered when measuring an optical power of the laser device of FIG. 1.

Finally, in a third scenario, shown in FIG. 6C, a ferrule can be used to abut an optical fiber to the laser transmitter. In this scenario, it is assumed that all of the available power, even above the 0.18 NA, couples to the fiber. However, since approximately 4% of the power reflects from each end of the fiber, the power exiting the output end of the fiber, i.e., the end away from the laser transmitter, is no more than 92% of the open bore power, i.e., −0.36 dB. Therefore, in this scenario, the actual measured power at the VCSEL without the fiber in place can be no more than −1.09+0.36=−0.73 dBm, however the measured power at the output end of the fiber can be no more than −1.09 dBm.

To comply with the eye safety requirements associated with a Class 1 categorization, it is desirable that a tested laser simultaneously comply with all three of the above-described limits. Keeping these three scenarios in mind, exemplary embodiments of the present invention provide a laser detector that is capable of measuring the power of both components of the laser beam, the direct beam and the reflected beam, to verify that a tested VCSEL meets the Class 1 laser specification described by the three scenarios above. With the AELs calculated, i.e., detected power within 0.18 NA less than −1.09 dBm and detected power within 0.243 NA less than +7.9 dBm, it is possible to use the detector 184 to validate these AELs.

Figure 7:
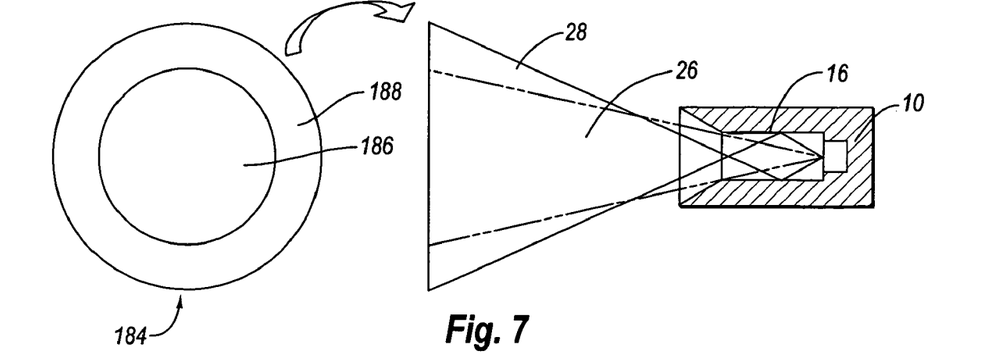
FIG. 7 illustrates one exemplary embodiment of a test geometry for the dual zone optical detector shown in FIGS. 3-5F.

One exemplary configuration of detector 184 of FIG. 5F is shown in FIG. 7. Detector 184 is divided into a first zone 186 specifically sized to measure only the direct laser beam 26 coming from the laser being tested and a second zone 188 sized to detect all of the reflected beam 28 coming from the sides of, for example, central bore 16 (FIG. 1). As indicated above, detectors having differing diameters and positioned at differing distances from the test laser can be chosen, so long as the measured power level is equivalent to that measured by a detector having a 50 mm diameter positioned 100 mm from the laser. To accommodate this, in one configuration, a two zone detector having the first zone 186 is sized and positioned a distance from the laser such that the measured power level has to be less than −1.09 dBm. This results in the first zone 186 having a diameter of approximately 7.11 mm and being positioned from the laser a distance of about 19.3 mm. This corresponds to a 0.18 NA for the first zone 186.

Turning to the second zone 186, which measures the reflected beam 28, it is not necessary to detect all the power generated by the laser. However, if desired, that can be achieved. Rather, it is desirable for the second zone 186 to detect the same power that would have fallen onto a detector having 50 mm diameter and located at a distance of 100 mm from the test laser. This results in a numerical aperture of 0.243. In one illustrative embodiment, the diameter is approximately 10.67 mm, resulting in the second zone 188 having a numerical aperture of 0.266. This is greater than the 0.243 NA, thereby allowing an accurate measurement of the total power.

More generally, in this exemplary embodiment, the size of the detection zones, and the offset distance between the laser source and the detector, are determined by the physical characteristics of the concentric detection circles or rings on detector 184. It is understood that these measurements are for the specific hardware discussed above. However, other physical layouts for the detector, and position of the detector relative to the laser being tested, are also possible. In addition, the formulas used in the standard can be used with any other physical detector design to calculate specific offset distances. Therefore, detectors having a first zone with a diameter greater or lesser than 7.11 mm are possible. Similarly, detectors having a second zone with a diameter greater or lesser than 10.67 mm are possible. Further, detectors having one or more zones are also possible. In addition, the position of the detector relative to the laser being tested can be greater or lesser than 19.33 mm, based upon the particular diameter of the detector zones.

With the measured power levels detected, the power of the laser can be adjusted using typical methods until the power of the direct beam is just below the Class 1 eye safety limit, i.e., −1.09 dBm for a 0.18 NA. This method allows slightly more power to emanate from the laser and still stay within the eye safety limit. As discussed above, the higher the power of the laser, the better the ac performance. Consequently, the present invention provides methods for detecting the output power level of a laser and increasing ac performance through adjusting the laser power level so that the power of the direct beam is just below the Class 1 eye safety limit, i.e., −1.09 dBm for a 0.18 NA.

In an alternate embodiment, if it is assumed that beam components 26 and 28 coming from laser 12 are symmetrical, then the actual detection zones can be smaller. For example, one could measure the power in each zone in a semicircular area and multiply the measured power by a factor of two to determine total power in each of the zones. Alternately, one could measure the power in a single quadrant and multiply by a factor of four to determine the total power.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for maximizing the optical power of a laser beam, having a first component and a second component, generated by a laser, the method comprising:
   measuring a first optical power of the first component of the laser beam, the first component being received directly by a detector from the laser;
   measuring a second optical power of a second component of the laser beam, the second component being received by the detector following reflection from any of a plurality of surfaces; and
   adjusting a total power level of the laser until said first optical power is less than a predetermined threshold.

2. The method of claim 1, wherein said predetermined threshold is a maximum power level for a laser device complying with a class 1 eye safety limit.

3. The method of claim 1, wherein said first optical power and said second optical power are measured using a single device.

4. The method of claim 1, further comprising detecting, using a detector having a first zone and a second zone, said first optical power and said second optical power.

5. A method of adjusting an optical power of a laser beam to a defined threshold using an optical detector, the laser beam having a first component that covers a first area on the detector, and a second component that covers a second coplanar area on the detector, the method comprising the steps of:
   measuring the first component to provide a first measurement;
   comparing said first measurement to the threshold; and
   adjusting the optical power of the laser until the first measurement is equal to the threshold, wherein the laser beam is generated by a laser contained within a housing having a central bore, and wherein the first component directly exits the bore, and the second component is reflected off of a surface of the bore before exiting the bore.

6. The method of claim 5, wherein the laser beam comes from a vertical cavity surface emitting laser contained within a housing having a central bore, and the laser beam has a wavelength of about 850 nanometers.

7. The method of claim 5, wherein said defined threshold is −0.01 dBm below a class 1 eye safety limit for laser devices.

8. The method of claim 5, wherein the first and second areas are annular.

9. The method of claim 5, farther comprising measuring the first component and multiplying by four to determine the first measurement when the power distribution of the first and second components is circularly symmetrical and the first and second areas are one quadrant of a circle.

10. The method of claim 5, further comprising measuring the first component and multiplying by two to determine the first measurement when the power distribution of the first and second components is circularly symmetrical and the first and second areas are one half of a circle.

11. A method for maximizing the optical power of a laser beam generated by a laser, the method comprising:
   detecting a first power output of a first component of the laser beam upon a first zone of a detector;
   detecting a second power output of a second component of the laser beam upon a second zone of the detector, wherein the second zone of the detector is substantially ring-shaped;
   comparing the said first power output against a predetermined threshold; and
   adjusting an optical power of the laser until said first power output is less than or equal to said predetermined threshold.

12. The method of claim 11, wherein said first zone and said second zone are coplanar.

13. The method of claim 11, wherein the laser has an apparent source point and wherein said first zone and said second zone are located about 19.3 millimeters (mm) from said source point.

14. The method of claim 12, wherein said first zone is a circle having a diameter of about 7.11 mm.

15. The method of claim 12, wherein said second zone is a ring adjacent to said first zone, said second zone having a diameter of about 10.67 mm.

16. The method of claim 11, wherein said optical power is less than about −1.09 decibel milliwatts (dBm).

17. The method of claim 11, wherein said optical power of said laser beam is less than about −0.73 dBm when said optical power is measured at a distance of 14 mm within a 7 mm diameter.

18. The method of claim 11, further comprising an act of reflecting the second component of the laser beam from a surface of a bore within which the laser beam is transmitted.

19. The method of claim 11, wherein the second zone surrounds the first zone.

* * * * *

UNITED STATES PATENT AND TRADEMARK OFFICE
CERTIFICATE OF CORRECTION

PATENT NO.       : 7,346,087 B2                                    Page 1 of 2
APPLICATION NO.  : 11/072192
DATED            : March 18, 2008
INVENTOR(S)      : Guenter et al.

It is certified that error appears in the above-identified patent and that said Letters Patent is hereby corrected as shown below:

Drawings
Sheet 2, replace Fig. 3 with the figure depicted below in which the mechanical fasteners have been correctly labeled --109-- instead of "110"

Fig. 3

Column 2
Line 54, change "10" to --10--

Signed and Sealed this

Seventeenth Day of August, 2010

David J. Kappos
*Director of the United States Patent and Trademark Office*

CERTIFICATE OF CORRECTION (continued)
U.S. Pat. No. 7,346,087 B2

Column 5
Line 21, change "know" to --known--
Line 37, change "5G" to --5F--
Line 66, change "102" to --104--

Column 7
Line 46, change "28 component" to --component 28--